US008035170B2

(12) United States Patent
Inaba

(10) Patent No.: US 8,035,170 B2
(45) Date of Patent: Oct. 11, 2011

(54) SEMICONDUCTOR DEVICE INCLUDING SRAM

(75) Inventor: Satoshi Inaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 12/323,005

(22) Filed: Nov. 25, 2008

(65) Prior Publication Data

US 2009/0134472 A1 May 28, 2009

(30) Foreign Application Priority Data

Nov. 26, 2007 (JP) ................................. 2007-304916

(51) Int. Cl.
*H01L 27/11* (2006.01)
(52) U.S. Cl. ................................. 257/401; 257/E27.098
(58) Field of Classification Search .................. 257/401, 257/E27.098, E27.099
See application file for complete search history.

(56) References Cited

U.S. PATENT DOCUMENTS

| 7,112,858 | B2 | 9/2006 | Inaba et al. | |
|---|---|---|---|---|
| 7,512,017 | B2* | 3/2009 | Chang | 365/188 |
| 7,812,373 | B2* | 10/2010 | Bauer et al. | 257/206 |
| 2007/0132009 | A1 | 6/2007 | Takeuchi et al. | |
| 2007/0189060 | A1 | 8/2007 | Inaba | |
| 2007/0264762 | A1* | 11/2007 | Yeo et al. | 438/157 |
| 2008/0179682 | A1* | 7/2008 | Bauer et al. | 257/365 |
| 2008/0210981 | A1* | 9/2008 | Chang et al. | 257/206 |

FOREIGN PATENT DOCUMENTS

WO WO 2005/036651 A1 4/2005

OTHER PUBLICATIONS

H. Kawasaki, et al., "Embedded Bulk FinFET SRAM Cell Technology with Planar FET Peripheral Circuit for *hp*32 nm node and beyond", 2006 Symposium on VLSI Technology Digest of Technical Papers, 2006, 2 pages.
U.S. Appl. No. 12/494,885, filed Jun. 30, 2009, Inaba.

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

A semiconductor device according to an embodiment of the invention includes: a semiconductor substrate; device regions formed on the semiconductor substrate, the device regions having a length direction in a predetermined direction; a plurality of transistors having gate electrodes, respectively, the gate electrodes extending in a direction approximately perpendicular to the predetermined direction, the plurality of transistors having a source/drain region and a channel region having a channel direction approximately parallel to the predetermined direction in the device region; a plurality of SRAM cells disposed in an array, each of the plurality of SRAM cells including the plurality of transistors; and a dummy region made of the substantially same material as that of the device regions, the dummy region being formed between the outermost device regions of the SRAM cells adjacent to each other in the direction approximately perpendicular to the predetermined direction, the dummy region having a length direction approximately parallel to the predetermined direction.

19 Claims, 9 Drawing Sheets

SEMICONDUCTOR DEVICE INCLUDING SRAM

CROSS-REFERENCE TO RELATED APPLICATIONS

This application is based upon and claims the benefit of priority from prior Japanese Patent Application No. 2007-304916, filed on Nov. 26, 2007, the entire contents of which are incorporated herein by reference.

BACKGROUND

A fin type transistor having a fin structure is known as one of the double gate type transistors each having a channel region held between two gate electrodes in order to enhance controllability for a current by the gate electrode. The fin type transistor has a property which has an advantage to enhance miniaturization of a device, cut-off characteristics and a carrier mobility, and to suppress a short channel effect.

A Static Random Access Memory (SRAM) using fin type transistors is known as a conventional semiconductor device. The SRAM using the fin type transistors, for example, is described in WO 05/036651 (pamphlet).

BRIEF SUMMARY

A semiconductor device according to an embodiment of the invention includes: a semiconductor substrate; device regions formed on the semiconductor substrate, the device regions having a length direction in a predetermined direction; a plurality of transistors having gate electrodes, respectively, the gate electrodes extending in a direction approximately perpendicular to the predetermined direction, the plurality of transistors having a source/drain region and a channel region having a channel direction approximately parallel to the predetermined direction in the device region; a plurality of SRAM cells disposed in an array, each of the plurality of SRAM cells including the plurality of transistors; and a dummy region made of the substantially same material as that of the device regions, the dummy region being formed between the outermost device regions of the SRAM cells adjacent to each other in the direction approximately perpendicular to the predetermined direction, the dummy region having a length direction approximately parallel to the predetermined direction.

DETAILED DESCRIPTION

First Embodiment

Figure 1A:
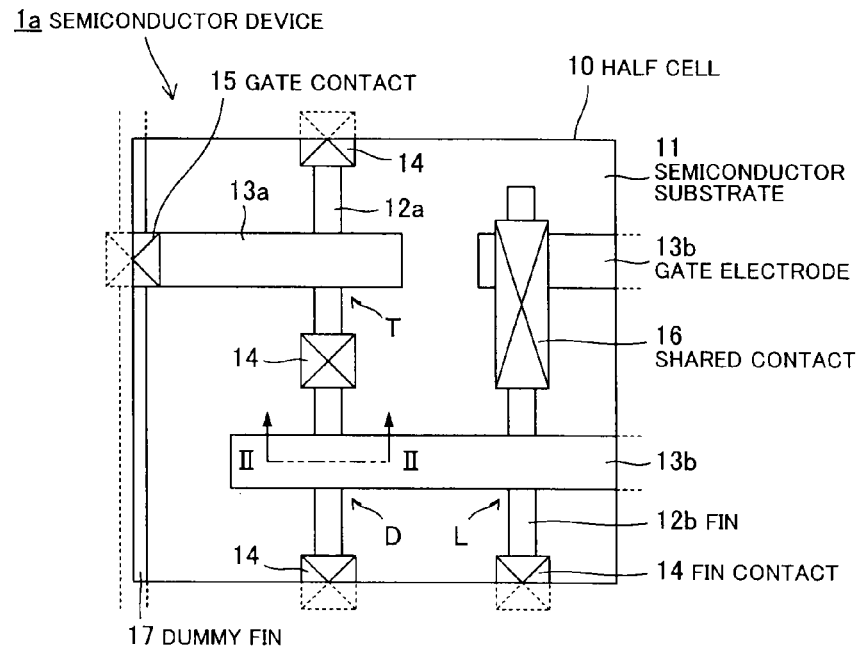
FIGS. 1A and 1B are respectively top plan views each schematically showing a semiconductor device according to a first embodiment.
Figure 1B:
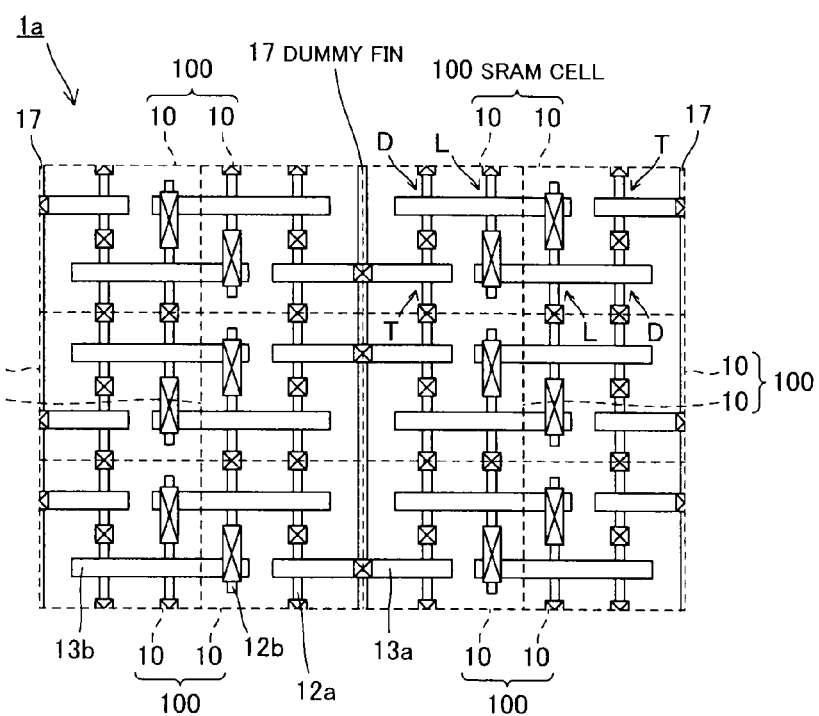
Figure 2:
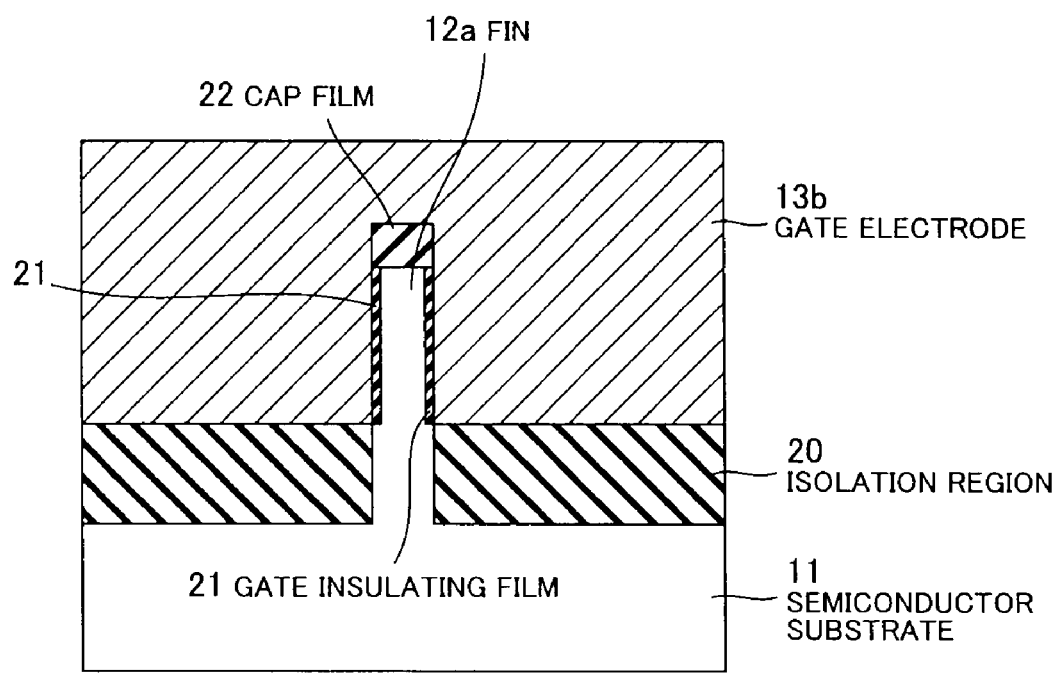
FIG. 2 is a cross sectional view when a cut surface in a cutting-plane line II-II shown in FIG. 1A showing the semiconductor device according to the first embodiment is viewed from an arrow in FIG. 1A.

FIG. 1A is a top plan view schematically showing an SRAM half cell of a semiconductor device according to a first embodiment, and FIG. 1B is a top plan view showing a state in which the SRAM half cells each shown in FIG. 1A are disposed in an array (in a matrix). In addition, FIG. 2 is a cross sectional view when a cut surface in a cutting-plane line II-II shown in FIG. 1A showing the semiconductor device according to the first embodiment is viewed from an arrow in FIG. 1A.

A 6-transistor type SRAM composed of fin type transistors will now be described in this embodiment. The 6-transistor type SRAM includes two n-channel transfer transistors, two n-channel driver transistors, and two p-channel load transistors in one SRAM cell.

A semiconductor device 1a includes three kinds of transistors of an n-channel transfer transistor T, an n-channel driver transistor D, and a p-channel load transistor L, a fin 12a including source/drain regions (not shown) of the n-channel transfer transistor T and the n-channel driver transistor D, a fin 12b including a source/drain region (not shown) of the p-channel load transistor L, a gate electrode 13a used in the n-channel transfer transistor T, and a gate electrode 13b used commonly to the n-channel drive transistor D and the p-channel load transistor L.

In addition, the n-channel transfer transistor T, the n-channel driver transistor D, and the p-channel load transistor L are formed on a semiconductor substrate 11, and are electrically isolated from one another by an isolation region 20.

A half cell 10 is obtained by dividing an SRAM cell 100 into halves, and includes one n-channel transfer transistor T, one n-channel driver transistor D, and one p-channel load transistor L.

As shown in FIG. 1B, the gate electrodes 13b of each two half cells 10 which are different in direction from each other by 180° are connected to each other in a way that the two p-channel load transistor L are disposed on an inner side, and the two n-channel transfer transistor T and the two n-channel driver transistor D are both disposed on outer sides, thereby structuring the SRAM cell 100 including the six transistors.

In addition, a dummy fin 17 is continuously formed between the fins 12a as the outermost fins of the SRAM cells 100 adjacent to each other in a direction approximately perpendicular to a length direction of each of the fins 12a and 12b. More preferably, the dummy fin 17 is located on a boundary extending in a direction approximately parallel to the length direction of each of the fins 12a and 12b (the vertical direction in FIGS. 1A and 1B) of boundaries between the adjacent SRAM cells 100, that is, on a boundary between the horizontally adjacent SRAM cells 100 shown in FIG. 1A.

Here, the boundary is equal to a frame of the SRAM cell 100 composed of two half cells 10 of frames of the half cells 10 each indicated by a dotted line in FIG. 1B. Also, the boundary is located in a middle portion between the fins 12a as the outermost fins of the SRAM cells 100 adjacent to each other in a direction approximately perpendicular to the length direction of each of the fins 12a and 12b. It is noted that although in each of the following embodiments, a description will be given on the assumption that the dummy fin 17 is formed, as a preferred example, on the boundary between the SRAM cells 100 adjacent to each other in the direction approximately perpendicular to the length direction of each of the fins 12a and 12b, the present invention is by no means limited thereto similarly to the case of this embodiment. That is to say, any other suitable dummy fin may also be adopted as long as it is formed between the fins 12a of the SRAM cells 100 adjacent to each other in the direction approximately perpendicular to the length direction of each of the fins 12a and 12b.

It is noted that illustrations of the isolation region 20 and a cap 22 are omitted here in FIGS. 1A and 1B for the sake of simplicity.

A Si substrate, a SiGe substrate, a substrate obtained by combining the Si substrate and the SiGe substrate with each other by utilizing a partially selective epitaxial growth method or the like can be used as the semiconductor substrate 2.

The isolation region 20 is made of an insulating material such as $SiO_2$.

The fins 12a and 12b each serving as the device region are formed by selectively etching a surface of the semiconductor substrate 2. Thus, each of the fins 12a and 12b is made of single-crystal Si, single-crystal SiGe or the like. In addition, each of the fins 12a and 12b includes a source region and a drain region on both sides of a region surrounded by opposite portions of the gate electrode 13a or the gate electrode 13b. A region which is surrounded by opposite portions of the gate electrode 13a or 13b, and is also held between the source region and the drain region acts as a channel region.

With regard to a conductivity type impurity contained in the source/drain region, an n-type impurity such as As or P is used in the case of each of the n-channel transfer transistor T and the n-channel driver transistor D. On the other hand, a p-type impurity such as B or $BF_2$ is used in the case of the p-channel load transistor L.

In addition, a fin contact 14 which is connected to the source region or the drain region is formed in a predetermined position of an upper surface of the fin 12a or 12b. The source region or the drain region of the fin 12a or 12b, and a wiring wired in an upper layer are electrically connected to each other through the fin contact 14.

The dummy fin 17 serving as a dummy device region, for example, is formed by selectively etching the surface of the semiconductor substrate 2 similarly to the case of each of the fins 12a and 12b. Also, the dummy fin 17 is made of the same material as that of each of the fins 12a and 12b. In addition, although the dummy fin 17 has the same fin width and fin height as those of each of the fins 12a and 12b, it does not function as a part of the transistor at all. For this reason, neither the source region nor the drain region may be formed in the dummy fin 17. In addition thereto, no fin contact 14 is connected to the dummy fin 17. Also, the dummy fin 17 is formed approximately in parallel to each of the fins 12a and 12b.

In addition, a spacing between the dummy fin 17 and the fin 12a adjacent thereto, a spacing between the fin 12a and the fin 12b adjacent to each other, and a spacing between the fins 12b adjacent to each other are preferably, approximately equal to one another.

Each of the gate electrodes 13a and 13b, for example, is made of polycrystalline silicon or polycrystalline silicon germanium containing therein a conductivity type impurity. With regard to the conductivity type impurity contained in each of the gate electrodes 13a and 13b, an n-type impurity such as As or P is used in the case of each of the n-channel transfer transistor T and the n-channel driver transistor D. On the other hand, a p-type impurity such as B or $BF_2$ is used in the case of the p-channel load transistor L. It is noted that a silicide layer may be formed on each of surfaces of the gate electrodes 13a and 13b. In addition, each of the gate electrodes 13a and 13b may be a full silicide electrode which is obtained by entire silicidation of the polycrystalline Si gate electrode. In addition, each of the gate electrodes 13a and 13b may be a metal gate electrode made of a metal selected from the group consisting of W, Ta, Ti, Hf, Zr, Ru, Pt, Ir, Mo, Al, Ni, and the like, a compound thereof, or the like. A nitrided metal can be also applicable. Also, each of the gate electrodes 13a and 13b may have a laminate structure of a metal gate electrode portion and a polycrystalline Si electrode portion. Moreover, a gate sidewall made of an insulating material may be formed on each of side surfaces of the gate electrodes 13a and 13b.

In addition, a gate contact 15 is formed in a predetermined position on each of upper surfaces of the gate electrodes 13a. The gate electrode 13a, and a wiring wired in the upper layer are electrically connected to each other through the gate contact 15. Also, a shared contact 16 as a contact which is shared between the gate electrode 13b and the fin 12b is formed on an upper surface of a corresponding portion of the gate electrode 13b and the fin 12b. The gate electrode 13b and the fin 12b, and the wiring wired in the upper layer are electrically connected to each other through the shared contact 16.

The gate insulating film 21, for example, is made of $SiO_2$, SiN, SiON or a High-k material (such as a Hf system material such as HfSiON, HfSiO or $HfO_2$, a Zr system material such as ZrSiON, ZrSiO or $ZrO_2$, or a Y system material such as $Y_2O_3$), or a material obtained by combining $SiO_2$, SiN, SiON or a High-k material with a rare metal system material.

A cap film 22 is made of an insulating material such as SiN, and serves as a mask, which is used in Reactive Ion Etching (RIE) for formation of the fins 12, or the like. Note that, a structure may also be adopted such that no cap layer 22 is provided, and the gate insulating film 21 is provided in an upper layer as well overlying the fin 12, so that a channel is formed in an upper surface as well of the fin 12.

Figure 3A:
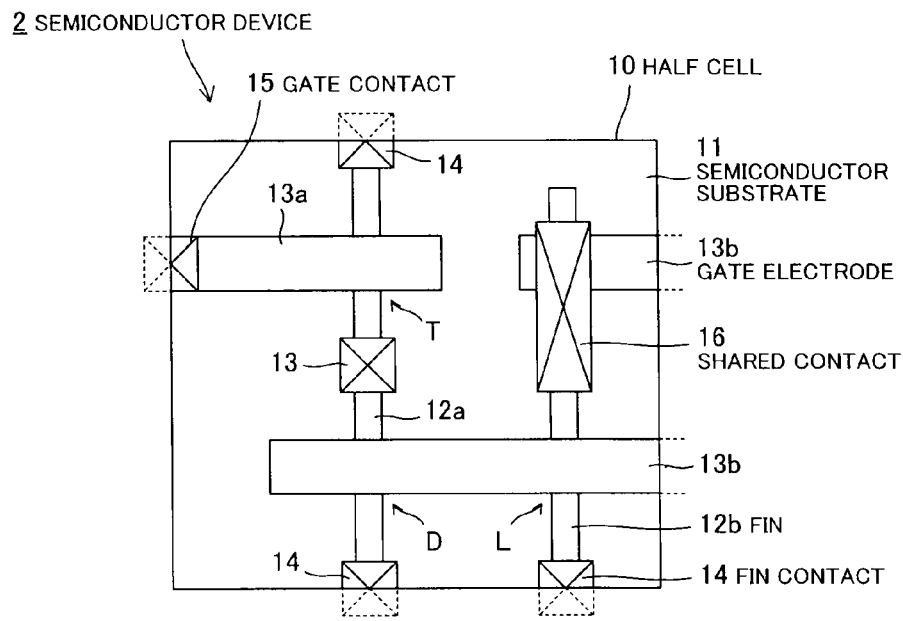
FIGS. 3A and 3B are respectively top plan views each schematically showing a semiconductor device, having no dummy fin, as a comparative example.
Figure 3B:
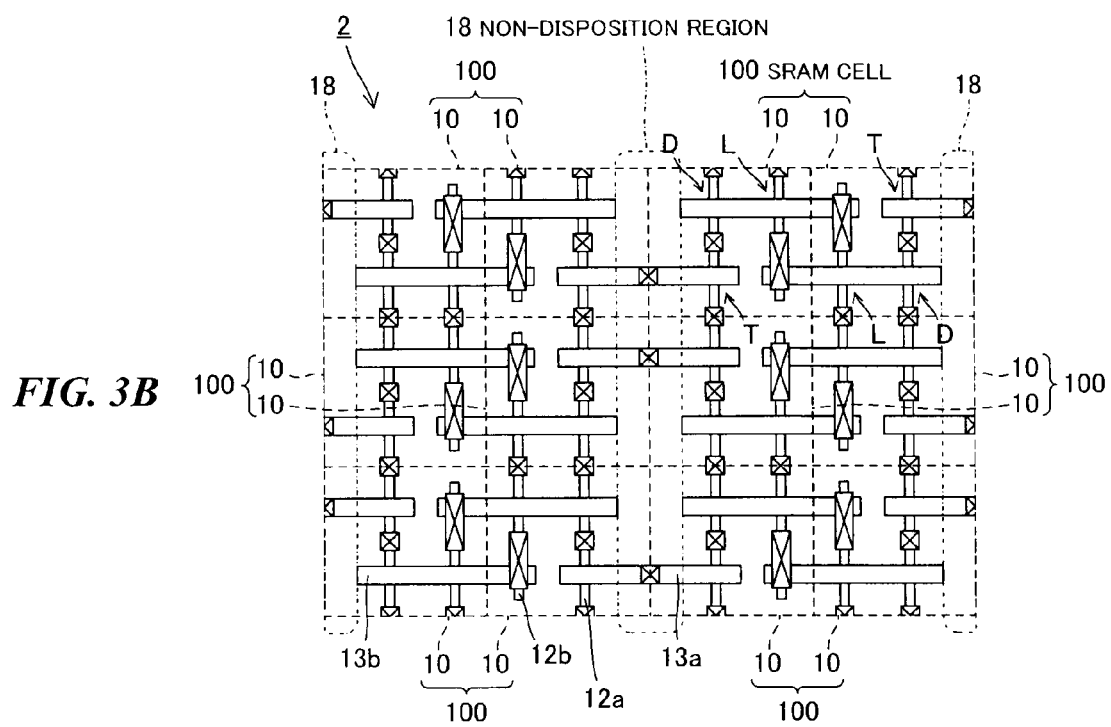

FIG. 3A is a top plan view schematically showing an SRAM half cell of a semiconductor device, having no dummy fin, as a comparative example, and FIG. 3B is a top plan view showing a state in which the SRAM half cells each shown in FIG. 3A are disposed in an array (in a matrix). A semiconductor device 2 of the comparative example is identical in structure to the semiconductor device 1a of the first embodiment except that the dummy fin 17 is removed from the semiconductor device 1a of the first embodiment.

According to the semiconductor device 2, having no dummy fin 17, of the comparative example, as shown in FIG. 3B, a non-disposition region 18 can be formed in which no fin is disposed on the boundary extending in the direction approximately parallel to the length direction of each of the fins 12a and 12b (the vertical direction in FIGS. 3A and 3B), that is, on the boundary between horizontally adjacent SRAM cells 100 shown in FIGS. 3A and 3B of boundaries between the adjacent SRAM cells 100.

When the non-disposition region 18 exists in such a manner, it is feared that the fin near the non-disposition region 18 (the fin 12a in the case shown in FIGS. 3A and 3B) has a shape and a thickness different from those of the fin in the region (the fin 12b in the case shown in FIGS. 3A and 3B) other than the non-disposition region 18, and thus the shape and thickness of the fins become nonuniform as a whole. Hereinafter, an example of the reason for this will be described.

Each of the fins 12a and 12b is formed by patterning the surface of the semiconductor substrate 11 by utilizing the RIE method. However, an amount of material (such as Si) of the semiconductor substrate 11 in the non-disposition region 18 ground by the etching is more than that in any region other than the non-disposition region 18 because no fin is formed in the non-disposition region 18. For this reason, an amount of material of the semiconductor substrate 11 restuck to the fin near the non-disposition region 18 increases, thereby fearing that the shape of the fin near the non-disposition region 18 is biased, and the thickness thereof increases. As a result, the fin near the non-disposition 18 has the shape and the thickness different from those of each of the fins which are formed at equal intervals in the regions other than the non-disposition region 18. Thus, it is feared that the deterioration of the electrical characteristics such as generation of the short channel effect is caused.

On the other hand, according to the semiconductor device 1a of the first embodiment, formation of the dummy fin 17 results in that the fins (the fins 12a and 12b, and the dummy fin 17) can be disposed at uniform intervals because no non-disposition region 18 is formed. As a result, the shapes and thicknesses of the fins 12a and 12b can be unified in the entire semiconductor device 1a, thereby suppressing the deterioration of the electrical characteristics.

It is noted that the n-channel transfer transistor T, the n-channel driver transistor D, and the p-channel load transistor L in this embodiment may be planar type transistors, respectively. In this case, the device region surrounded by the isolation region of the semiconductor substrate corresponds to the fins 12a and 12b, and the dummy fin 17, and the gate electrodes 13a and 13b are formed on the device region through the gate insulating film. Also, a region of the device region right under each of the gate electrodes 13a and 13b functions as a channel region, and the source region and the drain region are formed so as to hold the channel region between the source region and the drain region.

As a result, even when the n-channel transfer transistor T, the n-channel driver transistor D, and the p-channel load transistor L are the planar type transistors, respectively, formation of the dummy device region corresponding to the dummy fin 17 results in that the device regions (including the dummy device regions) can be disposed at uniform pitches because a region, in which no device is formed, corresponding to the non-disposition region 18 is not formed. As a result, the shapes and thicknesses of the fins 12a and 12b can be unified in the entire semiconductor device 1a, thereby suppressing the deterioration of the electrical characteristics.

Second Embodiment

A second embodiment is different in position where the dummy fin 17 is formed from the first embodiment. It is noted that a description of the same respects as those in the first embodiment is omitted here for the sake of simplicity.

Figure 4A:
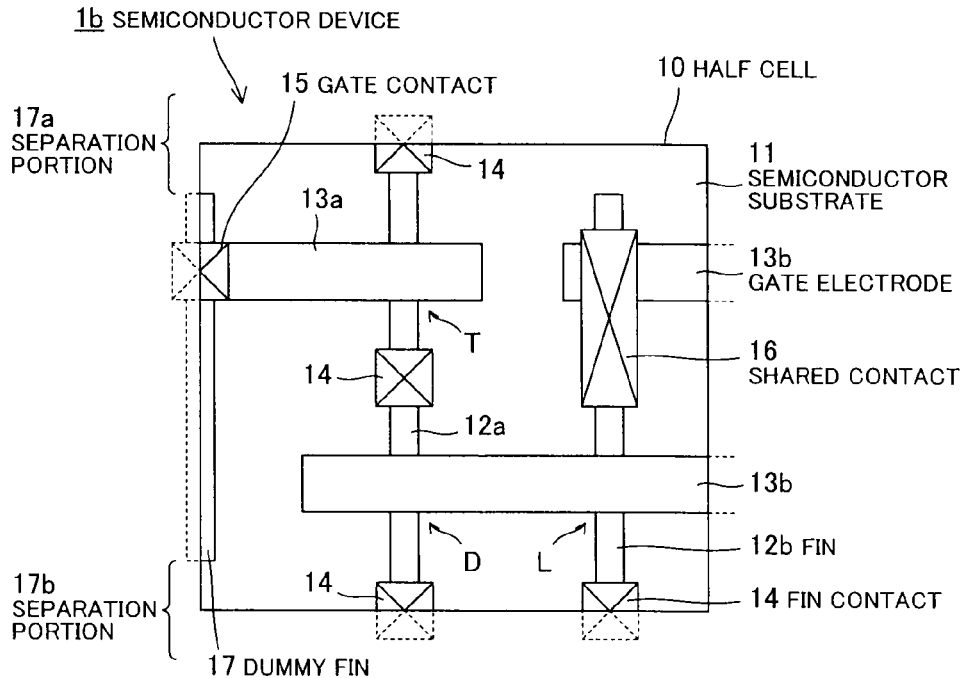
FIGS. 4A and 4B are respectively top plan views each schematically showing a semiconductor device according to a second embodiment.
Figure 4B:
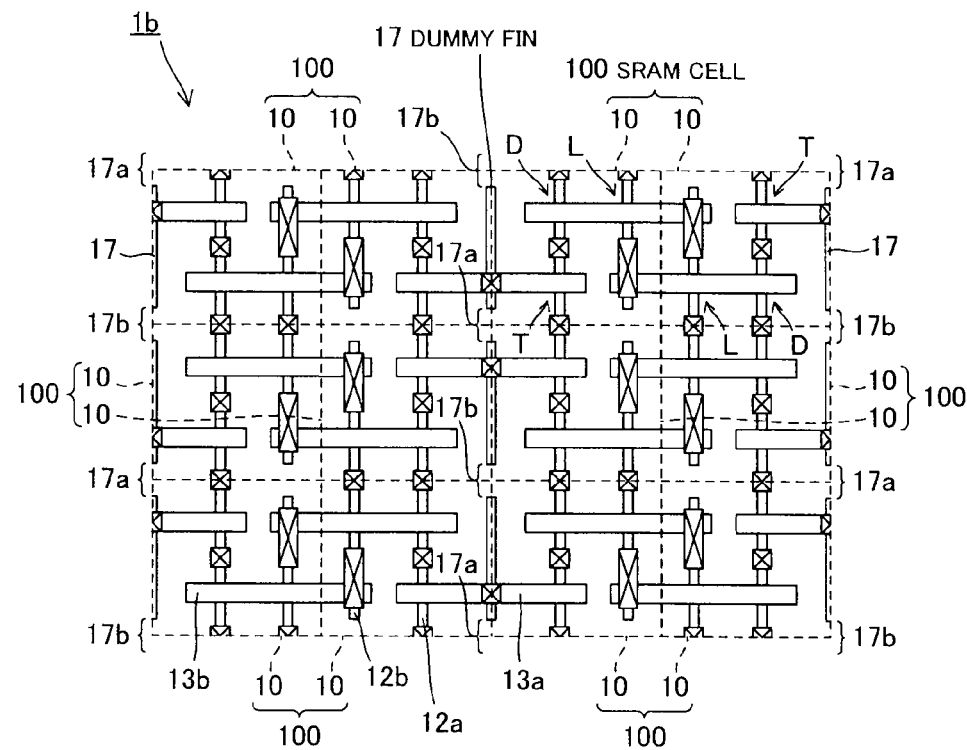

FIG. 4A is a top plan view schematically showing an SRAM half cell of a semiconductor device according to a second embodiment, and FIG. 4B is a top plan view showing a state in which the SRAM half cells each shown in FIG. 4A are disposed in an array (in a matrix).

As shown in FIGS. 4A and 4B, the dummy fin 17 is not formed on both ends of the boundary extending in the direction approximately parallel to the length direction of each of the fins 12a and 12b (the vertical direction in FIGS. 4A and 4B), that is, on both ends of the boundary between the horizontally adjacent SRAM cells 100 of the boundaries between the adjacent SRAM cells 100, and thus is separated on the boundary extending in the direction approximately perpendicular to the length direction of each of the fins 12a and 12b of the boundaries between the adjacent SRAM cells 100. Here, a separation portion, on the n-channel transfer transistor T side (on an upper side in FIG. 4A), of the dummy fin 17 is referred to as a separation portion 17a, and a separation portion, on the n-channel driver transistor D (on a lower side in FIG. 4A), of the dummy fin 17 is referred to as a separation portion 17b. The separation portion 17a and the separation portion 17b are preferably equal in separation width to each other.

According to the semiconductor device 1b of the second embodiment, even when a position where the gate contact 15 is formed is shifted, or a diameter of the gate contact 15 is made large, so that the gate contact 15 contacts an upper surface of the dummy fin 17, the dummy fin 17 is separated by the separation portions 17a and 17b, which results in that it is possible to suppress that a leakage current is caused to flow between the SRAM cells 100 adjacent to each other in the direction approximately perpendicular to the length direction of each of the fins 12a and 12b through the dummy fin 17.

It is noted that the n-channel transfer transistor T, the n-channel driver transistor D, and the p-channel load transistor L in this embodiment may be the planar type transistors, respectively.

Third Embodiment

A third embodiment is different in position where the dummy fin 17 is formed from the first embodiment. It is noted that a description of the same respects as those in the first embodiment is omitted here for the sake of simplicity.

Figure 5A:
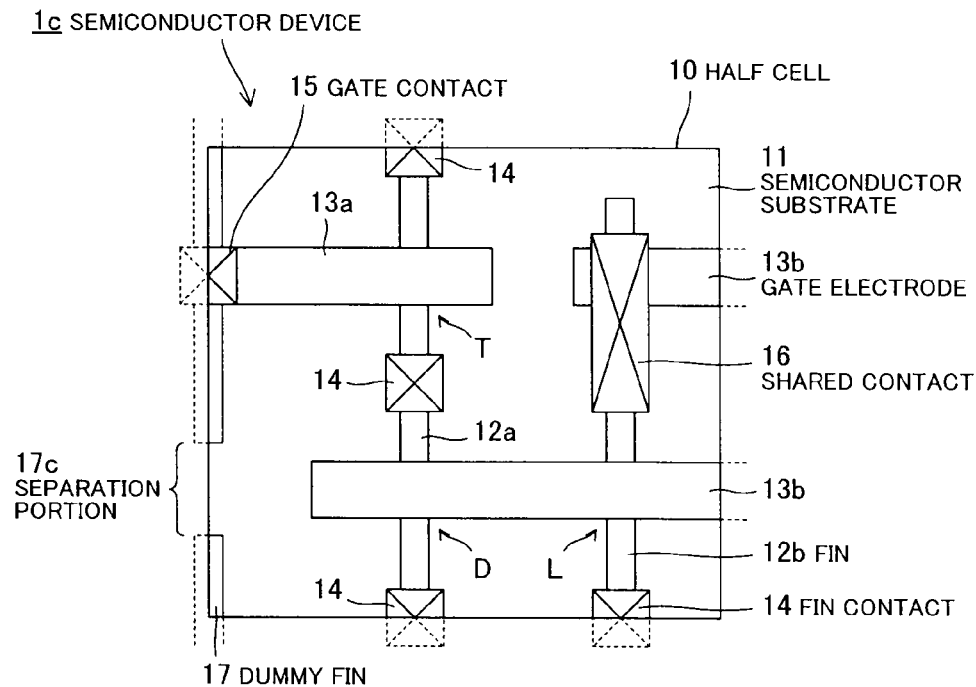
FIGS. 5A and 5B are respectively top plan views each schematically showing a semiconductor device according to a third embodiment.
Figure 5B:
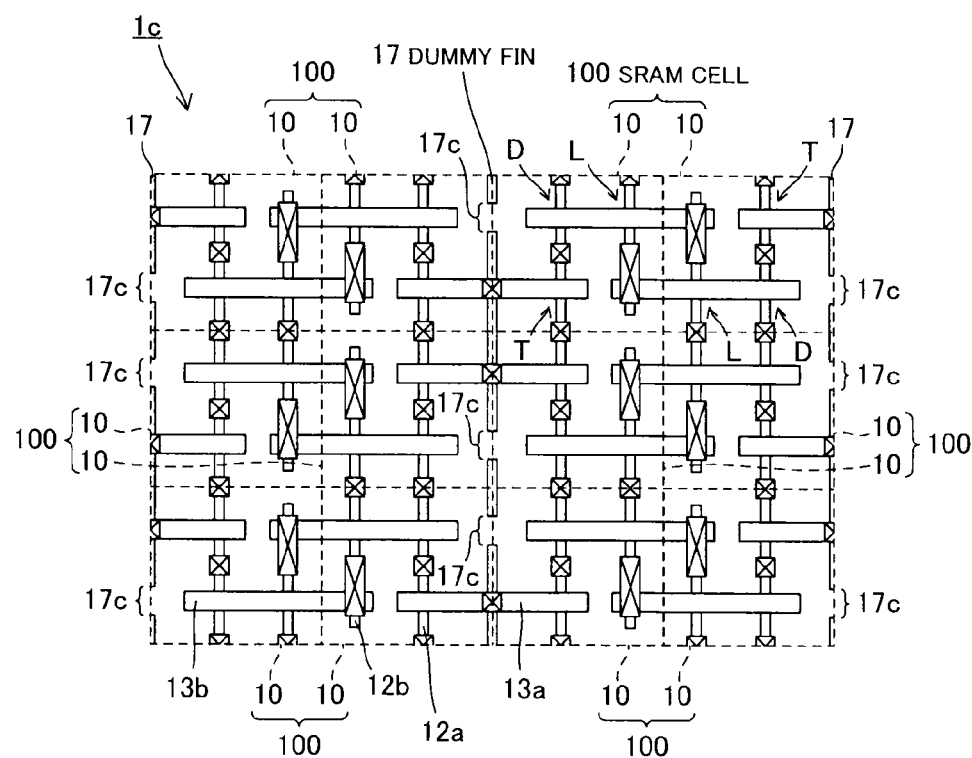

FIG. 5A is a top plan view schematically showing an SRAM half cell of a semiconductor device according to a third embodiment, and FIG. 5B is a top plan view showing a state in which the SRAM half cells each shown in FIG. 5A are disposed in an array (in a matrix).

As shown in FIGS. 5A and 5B, the dummy fin 17 is separated in a separation portion 17c as a region (a region lying on an extension in the length direction of the gate electrode 13b) having both sides held between the gate electrodes 13b of the SRAM cells 100 adjacent to each other in the direction approximately perpendicular to the length direction of each of the fins 12a and 12b. It is noted that a separation width of the separation portion 17c of the dummy fin 17 may not be equal to a width of the gate electrode 13b.

According to the semiconductor device 1c of the third embodiment, the dummy fin 17 is separated in the separation portion 17c as the region having the both sides held between the gate electrodes 13b in the manner as described above. Therefore, it is possible to suppress that an unnecessary parasitic capacitance is generated between the gate electrode 13b and the dummy fin 17. In particular, this embodiment produces an effect in the case where a high-speed operation of the transistor is required.

It is noted that the n-channel transfer transistor T, the n-channel driver transistor D, and the p-channel load transistor L in this embodiment may be the planar type transistors, respectively. In addition, this embodiment can be combined with the second embodiment.

Figure 6A:
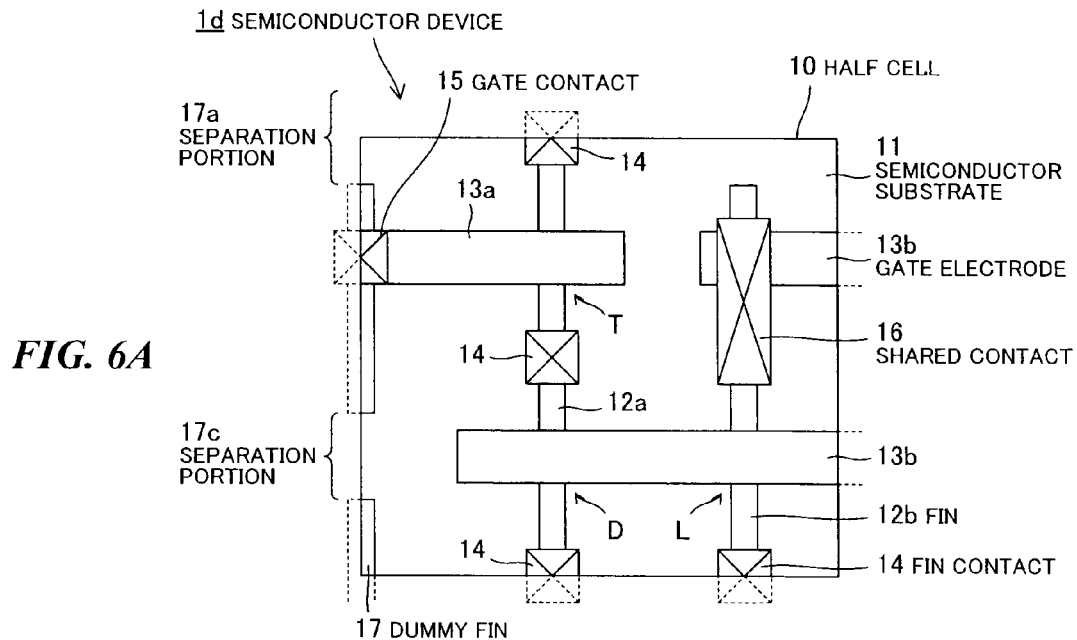
FIGS. 6A and 6B are respectively top plan views each schematically showing a variation of the semiconductor device according to the third embodiment.
Figure 6B:
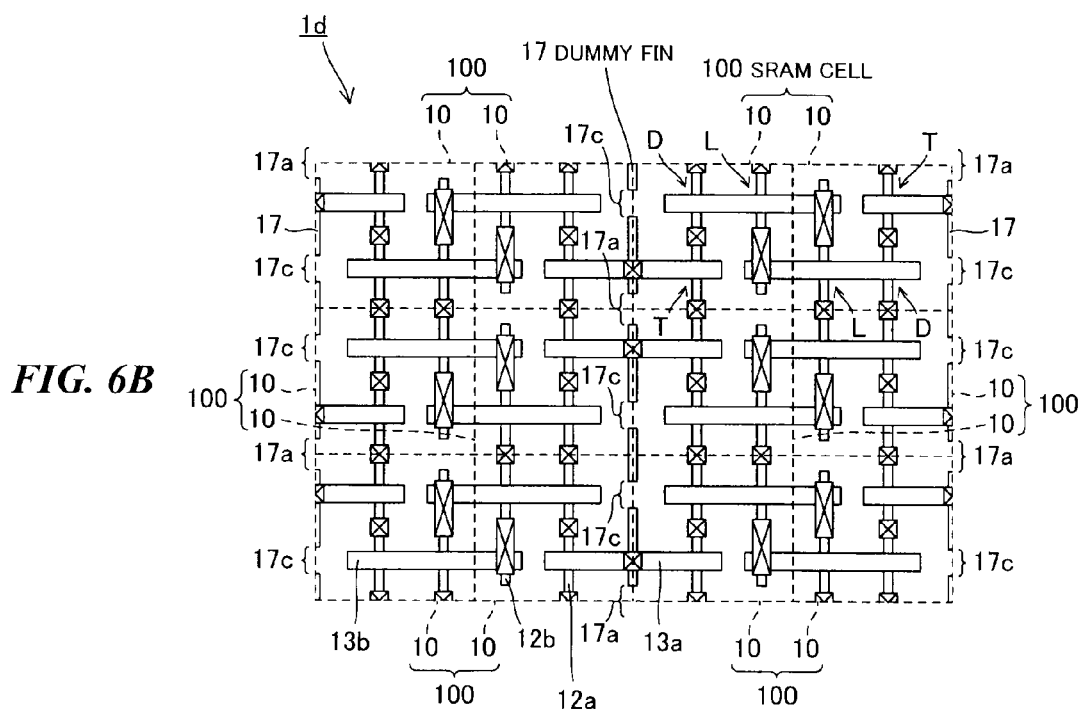

In addition, as the semiconductor device 1d shown in FIGS. 6A and 6B as a variation of the semiconductor device 1c of the third embodiment, a structure may also be adopted such that the dummy fin 17 is separated in a separation portion 17a in the second embodiment, in addition to the separation portion 17c.

As a result, even when a position where the gate contact 15 is formed is shifted, or the diameter of the gate contact 15 is made large, so that the gate contact 15 contacts the upper surface of the dummy fin 17, it is possible to suppress that the leakage current is caused to flow between the SRAM cells 100 adjacent to each other in the direction approximately perpendicular to the length direction of each of the fins 12a and 12b through the dummy fin 17.

Fourth Embodiment

A fourth embodiment is different in shape of the gate electrode 13b holding the dummy fin 17 between the opposite portions thereof from the first embodiment. It is noted that a description of the same respects as those in the first embodiment is omitted here for the sake of simplicity.

Figure 7A:
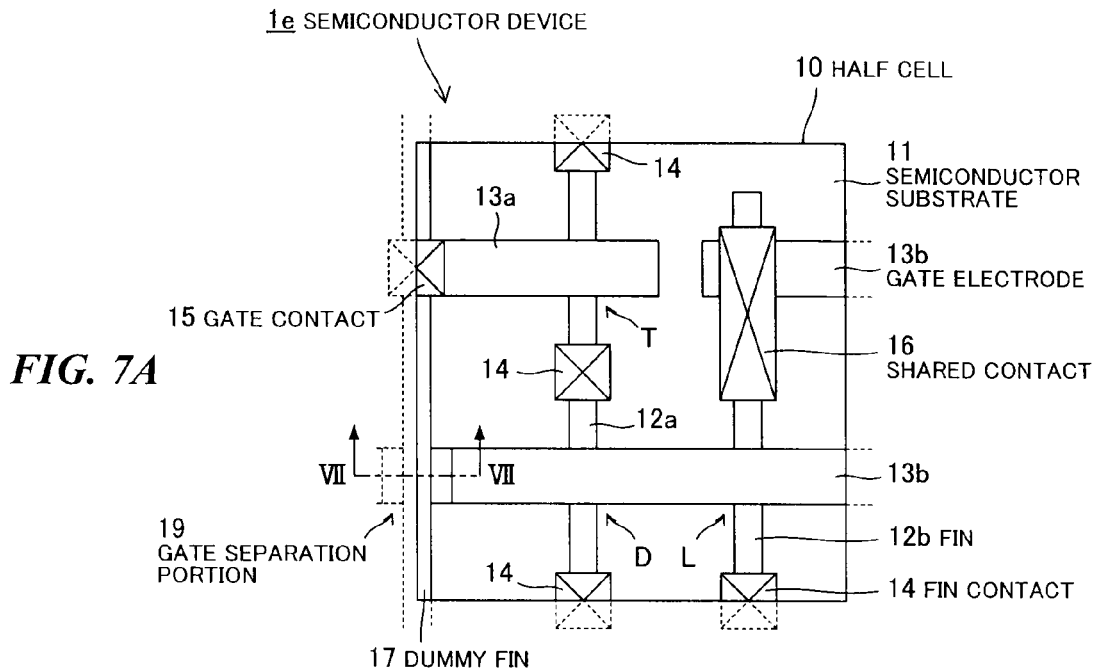
FIGS. 7A and 7B are respectively top plan views each schematically showing a semiconductor device according to a fourth embodiment.
Figure 7B:
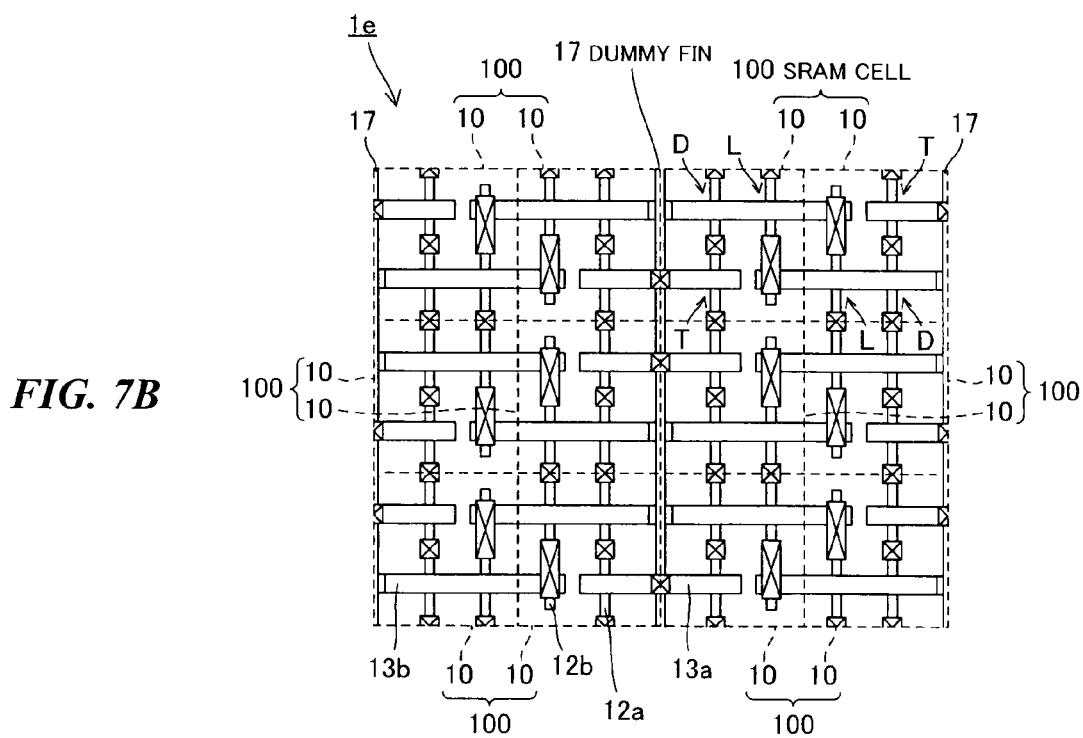

FIG. 7A is a top plan view schematically showing an SRAM half cell of a semiconductor device according to a fourth embodiment, and FIG. 7B is a top plan view showing a state in which the SRAM half cells each shown in FIG. 7A are disposed in an array (in a matrix). In addition, FIG. 8 is a cross sectional view when a cut surface in a cutting-plane line VII-VII shown in FIG. 7A showing the semiconductor device according to the fourth embodiment is viewed from an arrow in FIG. 7A.

Figure 8:
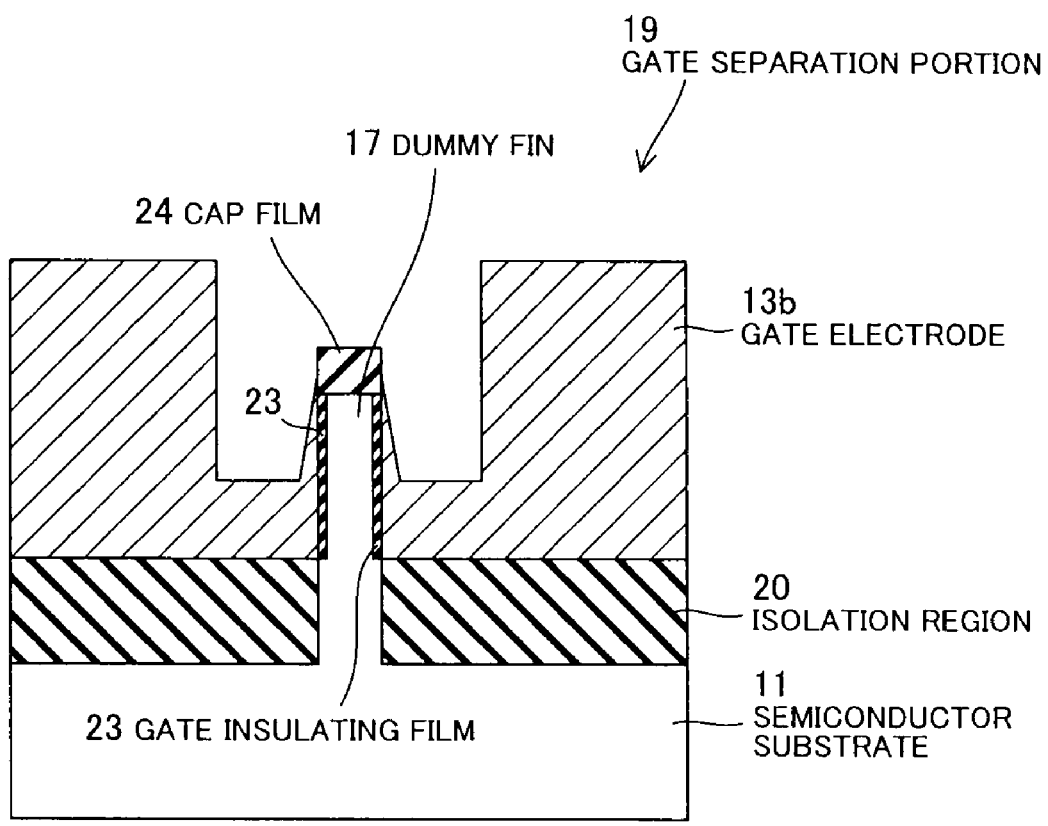
FIG. 8 is a cross sectional view when a cut surface in a cutting-plane line VII-VII shown in FIG. 7A showing the semiconductor device according to the fourth embodiment is viewed from an arrow in FIG. 7A.

As shown in FIGS. 7A and 7B, and FIG. 8, in the semiconductor device 1e of this embodiment, the gate electrodes 13b of the SRAM cells 100 adjacent to each other in the direction approximately perpendicular to the length direction of each of the fins 12a and 12b contact the gate insulating films 23 on the both side surfaces of the dummy fin 17 located between the gate electrodes 13b of the adjacent SRAM cells 100, and do not contact each other. It is noted that after being firstly formed integrally with each other, these gate electrodes 13b are processed so as to be separated from each other through the fin 12c by performing the etching.

The gate electrode 13b becomes lower in height in the vicinity of the dummy fin 17 and thus does not contact an upper surface of the cap film 24. The gate electrodes 13b of the adjacent SRAM cells 100 are electrically separated from each other because the gate insulating film 23 and the cap film 24 are made of the insulators, respectively. It is noted that the region in which the gate electrodes 13b are separated from each other through the dummy fin 17 is referred to as a gate separation region 19.

When the gate electrode 13b is formed so as to be separated from the dummy fin 17 as in the case of the first embodiment, a separation portion needs to be approximately, perfectly removed away (until an upper surface of the isolation region 20 is exposed). In order to approximately, perfectly remove the separation portion for the gate electrode 13b, an opening width corresponding to a height of the gate electrode 13b is required in terms of the etching property. For this reason, the n-channel driver transistors D of the SRAM cells 100 adjacent to each other in the direction approximately perpendicular to the length direction of each of the fins 12a and 12b can not be disposed close to each other so much.

On the other hand, according to the semiconductor device 1e of the fourth embodiment, the gate electrodes 13b of the adjacent SRAM cells 100 contact the gate insulating films on the both side surfaces of the dummy fin 17 located between the gate electrodes 13b of the adjacent SRAM cells 100, respectively, and are reduced in heights thereof in the vicinities of the dummy fin 17. As a result, the gate electrodes 13b of the adjacent SRAM cells 100 are electrically separated from each other. For this reason, the opening width can be reduced as compared with the case where the portion of the gate electrode 13b corresponding to the separation portion is perfectly removed to a lower portion thereof. As a result, the n-channel driver transistors D of the SRAM cells 100 adjacent to each other in the direction approximately perpendicular to the length direction of each of the fins 12a and 12b can be disposed close to each other, which results in that it is possible to reduce the size of the SRAM cell 100.

It is noted that in this embodiment, as shown in FIGS. 7A and 7B, each of the spacing between the fin 12a and the fin 12b adjacent thereto, and the spacing between the fins 12b adjacent to each other is narrowed so as to be equal to the spacing between the dummy fin 17 and the fin 12a adjacent thereto.

In addition, this embodiment can be combined with the second embodiment.

Fifth Embodiment

A fifth embodiment is different from the fourth embodiment in that the gate separation portion is provided in two portions. It is noted that a description of the same respects as those in the fourth embodiment is omitted here for the sake of simplicity.

Figure 9A:
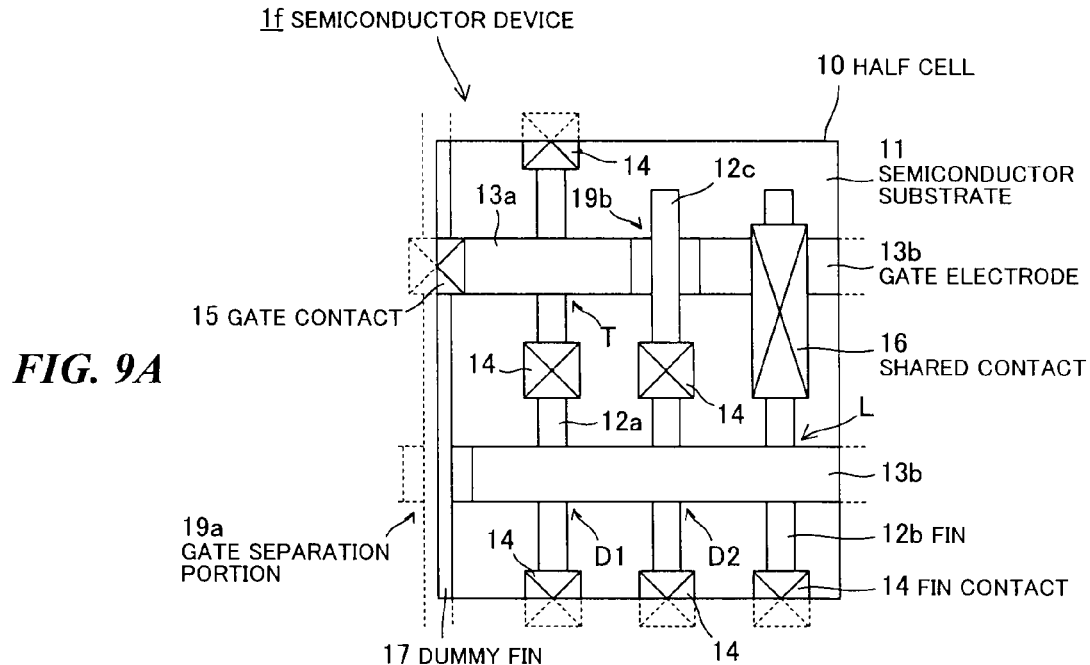
FIGS. 9A and 9B are respectively top plan views each schematically showing a semiconductor device according to a fifth embodiment.
Figure 9B:
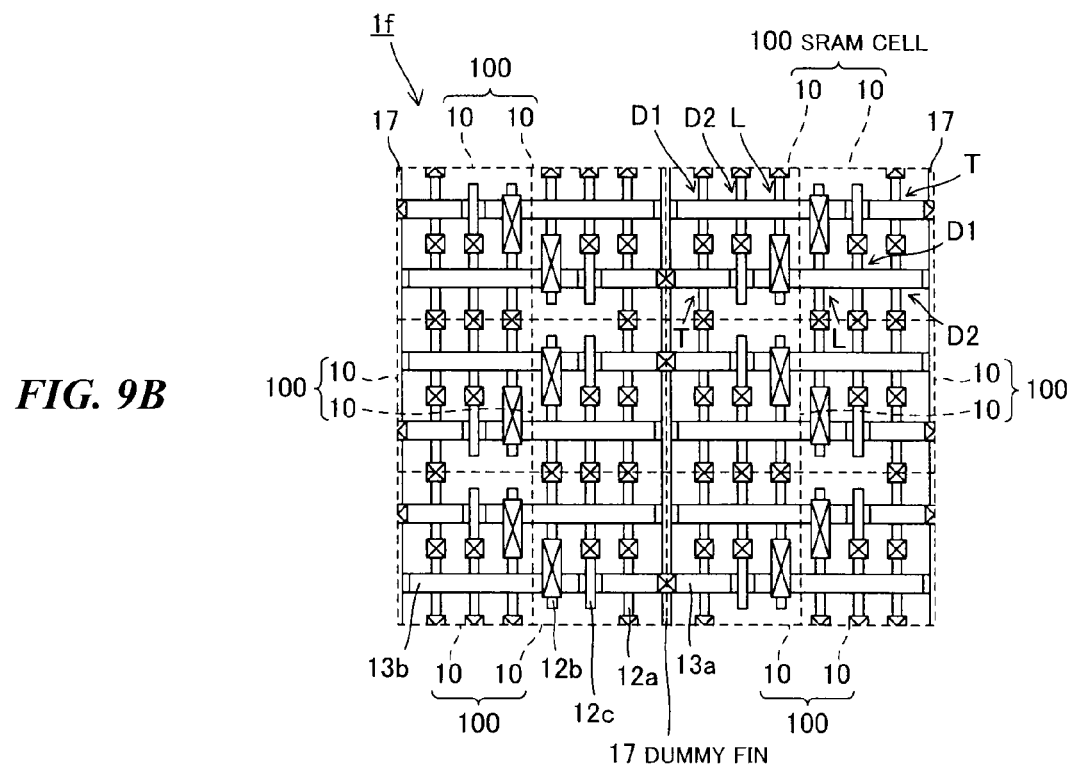

FIG. 9A is a top plan view schematically showing an SRAM half cell of a semiconductor device according to a fifth embodiment, and FIG. 9B is a top plan view showing a state in which the SRAM half cells each shown in FIG. 9A are disposed in an array (in a matrix).

As shown in FIGS. 9A and 9B, the semiconductor device 1f of this embodiment includes two n-channel driver transistors of n-channel driver transistors D1 and D2. The source/drain regions of the n-channel transfer transistor T and the n-channel driver transistor D1 are included in the fin 12a, and the source/drain region of the n-channel driver transistor D2 are included in a fin 12c.

In addition, the semiconductor device 1f includes a gate separation portion 19a in which the adjacent gate electrodes 13b are separated from each other through the dummy fin 17 similarly to the case of the gate separation portion 19 in the fourth embodiment. Also, the semiconductor device 1f includes a gate separation portion 19b in which the gate electrode 13a and the gate electrode 13b are separated from each other through the fin 12c. Each of the gate separation portions 19a and 19b has the same structure as that of the gate separation portion 19 in the fourth embodiment. Also, after being firstly formed integrally with each other, the gate electrode 13a and the gate electrode 13b are processed by performing the etching so as to be separated from each other through the fin 12c.

According to the semiconductor device 1f of the fifth embodiment, provision of the gate separation portions 19a and 19b results in that the portions of the gate electrodes 13a and 13b which should be approximately, perfectly removed (until the upper surface of the isolation region 20 is exposed) can be both made unnecessary, thereby making it possible to more efficiently dispose the fins 12a, 12b and 12c.

In addition, provision of the two n-channel driver transistors results in that generation of the noises can be suppressed, and thus the operation stability in a phase of the reading-out operation can be enhanced.

In addition, this embodiment can be combined with the second embodiment.

Other Embodiments

Embodiments are by no means limited to the first to fifth embodiments described above, and various changes can be made insofar they are within the gist of the invention. For example, although in each of the first to fifth embodiments, the description has been given so far with respect to the 6-transistor type SRAM in which the sixth transistors are included in the SRAM cell 100, the number of transistors included in the SRAM cell 100 is by no means limited thereto.

In addition, the constituent devices of the embodiments described above can be arbitrarily combined with one another without departing from the gist of the invention.

What is claimed is:

1. A semiconductor device, comprising:
a semiconductor substrate;
device regions formed on the semiconductor substrate, the device regions having a length direction in a predetermined direction;
a plurality of transistors having gate electrodes, respectively, the gate electrodes extending in a direction approximately perpendicular to the predetermined direction, the plurality of transistors having a source/drain region and a channel region having a channel direction approximately parallel to the predetermined direction in the device region;
a plurality of SRAM cells disposed in an array, each of the plurality of SRAM cells including the plurality of transistors; and
a dummy region made of the substantially same material as that of the device regions, the dummy region being formed between outermost device regions of the SRAM cells adjacent to each other in the direction approximately perpendicular to the predetermined direction, the dummy region having a length direction approximately parallel to the predetermined direction, wherein
each SRAM cell includes a plurality of transfer transistors, a plurality of driver transistors, and a plurality of load transistors;
in each SRAM cell, two of the load transistors are disposed on an inner side of the SRAM cell, and two of the transfer transistors and two of the driver transistors are both disposed on outer sides of the SRAM cell;
gate electrodes of one of the load transistors and one of the driver transistors in each SRAM cell are commonly connected to an end of another load transistor in the SRAM cell;
gate electrodes of the transfer transistors, which are respectively included in the SRAM cells adjacent to each other, are connected to each other; and
gate contacts connecting the gate electrodes of the transfer transistors to wirings thereabove are disposed above the dummy region.

2. The semiconductor device according to claim 1, wherein the dummy region is located on a boundary between the SRAM cells adjacent to each other in the direction approximately perpendicular to the predetermined direction.

3. The semiconductor device according to claim 1, wherein a distance between a device region and the dummy region adjacent to each other is approximately equal to a distance between two device regions adjacent to each other.

4. The semiconductor device according to claim 1, wherein the plurality of transistors are fin type transistors, respectively, the device regions are fins, and the dummy region is a dummy fin.

5. The semiconductor device according to claim 1, wherein the dummy region is continuously formed between the outermost device regions of the SRAM cells adjacent to each other in the direction approximately perpendicular to the predetermined direction.

6. The semiconductor device according to claim 1, wherein the dummy region is separated on a boundary, between the adjacent SRAM cells, extending in the direction approximately perpendicular to the predetermined direction.

7. The semiconductor device according to claim 6, wherein a distance between a device region and the dummy region adjacent to each other is approximately equal to a distance between two device regions adjacent to each other.

8. The semiconductor device according to claim 6, wherein the plurality of transistors are fin type transistors, respectively, the device regions are fins, and the dummy region is a dummy fin.

9. The semiconductor device according to claim 6, wherein the plurality of transistors includes a plurality of driver transistors, the plurality of SRAM cells includes the plurality of driver transistors, and the dummy region is separated in a region thereof having both sides held between gate electrodes of the driver transistors of the adjacent SRAM cells.

10. The semiconductor device according to claim 9, wherein the plurality of transistors are fin type transistors, respectively, the device regions are fins, and the dummy region is a dummy fin.

11. The semiconductor device according to claim 1, wherein the plurality of transistors include a plurality of driver transistors, the plurality of SRAM cells includes the plurality of driver transistors, and the dummy region is separated in a region thereof having both sides held between gate electrodes of the driver transistors of the adjacent SRAM cells.

12. The semiconductor device according to claim 11, wherein the dummy region is located on a boundary between the SRAM cells adjacent to each other in the direction approximately perpendicular to the predetermined direction.

13. The semiconductor device according to claim 11, wherein the plurality of transistors are fin type transistors, respectively, the device regions are fins, and the dummy region is a dummy fin.

14. A semiconductor device, comprising:
a semiconductor substrate;
device regions formed on the semiconductor substrate, the device regions having a length direction in a predetermined direction;
a plurality of transistors having gate electrodes, respectively, the gate electrodes extending in a direction approximately perpendicular to the predetermined direction, the plurality of transistors having a source/drain region and a channel region having a channel direction approximately parallel to the predetermined direction in the device region;
a plurality of SRAM cells disposed in an array, each of the plurality of SRAM cells including the plurality of transistors; and
a dummy region made of the substantially same material as that of the device regions, the dummy region being formed between outermost device regions of the SRAM cells adjacent to each other in the direction approximately perpendicular to the predetermined direction, the dummy region having a length direction approximately parallel to the predetermined direction, wherein the plurality of transistors are fin type transistors, respectively, and include a plurality of transfer transistors, a plurality of driver transistors, and a plurality of load transistors;

the device regions are a plurality of fins having gate insulating films on their side surfaces, respectively;

the dummy region is a plurality of dummy fins having gate insulating films on side surfaces thereof, respectively;

the plurality of SRAM cells includes the plurality of transfer transistors, the plurality of driver transistors, and the plurality of load transistors; and in the SRAM cells, a gate electrode of the transfer transistor and a gate electrode of the load transistor contact the gate insulating films on both side surfaces of a fin of the driver transistor located between these gate electrodes, respectively, and do not contact each other.

15. The semiconductor device according to claim 14, wherein the dummy fin is located on a boundary between the SRAM cells adjacent to each other in the direction approximately perpendicular to the predetermined direction.

16. A semiconductor device, comprising:
a semiconductor substrate;
device regions formed on the semiconductor substrate, the device regions having a length direction in a predetermined direction;
a plurality of transistors having gate electrodes, respectively, the gate electrodes extending in a direction approximately perpendicular to the predetermined direction, the plurality of transistors having a source/drain region and a channel region having a channel direction approximately parallel to the predetermined direction in the device region;
a plurality of SRAM cells disposed in an array, each of the plurality of SRAM cells including the plurality of transistors; and
a dummy region made of the substantially same material as that of the device regions, the dummy region being formed between outermost device regions of the SRAM cells adjacent to each other in the direction approximately perpendicular to the predetermined direction, the dummy region having a length direction approximately parallel to the predetermined direction, wherein the plurality of transistors are fin type transistors, respectively, and include a plurality of transfer transistors, a plurality of driver transistors, and a plurality of load transistors;

the device regions are a plurality of fins having gate insulating films on their side surfaces, respectively;

the dummy region is a plurality of dummy fins having gate insulating films on side surfaces thereof, respectively;

the plurality of SRAM cells includes the plurality of transfer transistors, the plurality of driver transistors, and the plurality of load transistors; and in the SRAM cells, a gate electrode of the transfer transistor and a gate electrode of the load transistor contact the gate insulating films on both side surfaces of a fin of the driver transistor located between these gate electrodes, respectively, and do not contact each other.

17. The semiconductor device according to claim 16, wherein the dummy fin is located on a boundary between the SRAM cells adjacent to each other in the direction approximately perpendicular to the predetermined direction.

18. The semiconductor device according to claim 16, wherein the dummy fin is located on a boundary between the SRAM cells adjacent to each other in the direction approximately perpendicular to the predetermined direction.

19. The semiconductor device according to claim 16, wherein a distance between the fin and the dummy fin adjacent to each other is approximately equal to a distance between two fins adjacent to each other.

* * * * *